(12) United States Patent
Bayraktaroglu et al.

(10) Patent No.: US 9,082,794 B1
(45) Date of Patent: Jul. 14, 2015

(54) METAL OXIDE THIN FILM TRANSISTOR FABRICATION METHOD

(71) Applicant: The United States of America, as represented by the Secretary of the Air Force, Washington, DC (US)

(72) Inventors: Burhan Bayraktaroglu, Yellow Springs, OH (US); Kevin D Leedy, Dayton, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 14/249,983

(22) Filed: Apr. 10, 2014

(51) Int. Cl.
| H01L 21/16 | (2006.01) |
| H01L 29/66 | (2006.01) |
| H01L 29/49 | (2006.01) |
| H01L 21/467 | (2006.01) |
| H01L 29/786 | (2006.01) |

(52) U.S. Cl.
CPC ........ *H01L 29/66969* (2013.01); *H01L 21/467* (2013.01); *H01L 29/495* (2013.01); *H01L 29/4908* (2013.01); *H01L 29/7869* (2013.01)

(58) Field of Classification Search
CPC ................ H01L 21/467; H01L 21/707; H01L 2021/775
USPC ......................................... 438/159
See application file for complete search history.

(56) References Cited

U.S. PATENT DOCUMENTS

| 5,532,180 | A | 7/1996 | den Boer et al. |
| 5,872,370 | A | 2/1999 | Gu et al. |
| 7,537,979 | B2 | 5/2009 | Isobe et al. |
| 7,691,666 | B2 * | 4/2010 | Levy et al. ..................... 438/104 |
| 7,910,920 | B2 | 3/2011 | Park et al. |
| 7,915,075 | B2 | 3/2011 | Suzawa et al. |
| 7,994,510 | B2 | 8/2011 | Jeong et al. |
| 8,119,465 | B1 | 2/2012 | Lin et al. |
| 8,129,717 | B2 | 3/2012 | Yamazaki et al. |
| 8,187,919 | B2 | 5/2012 | Seo et al. |
| 8,398,725 | B2 | 3/2013 | Tanaka et al. |
| 8,455,310 | B2 * | 6/2013 | Yim ............................ 438/151 |
| 2006/0043447 | A1 | 3/2006 | Ishii et al. |

OTHER PUBLICATIONS

Austin et al, "Fabrication of 70 nm channel length polymer organic thin-film transistors using nanoimprint lithography," Applied Physics Letters, vol. 81, No. 23, Dec. 2, 2002.

(Continued)

*Primary Examiner* — Chandra Chaudhari
(74) *Attorney, Agent, or Firm* — AFMCLO/JAZ; Charles Figer Jr.

(57) ABSTRACT

A method is provided for fabricating a thin film transistor. An insulating and a metal gate contact layer are deposited on a substrate with the insulating layer being positioned between the gate contact layer and the substrate. A portion of the gate contact layer is selectively removed utilizing reactive ion etching incorporating a gas that etches the gate contact layer but not the insulating layer. A plurality of layers is deposited over a remaining portion of the gate contact layer and insulating layer, which include a gate insulating layer, a channel layer, and a metal film. A portion of the metal film is selectively removed utilizing reactive ion etching incorporating the gas that etches the metal film but not the channel layer. The insulating layer includes a high resistivity insulator that can be deposited at temperatures less than 400° C. and the channel layer is comprised of a metal oxide semiconductor.

13 Claims, 11 Drawing Sheets

(56) References Cited

OTHER PUBLICATIONS

Collet et al., "Low-voltage, 30 nm channel length, organic transistors with a self-assembled monolayer as gate insulating films," Appl. Phys. Lett. 76, 1941 (2000).

Jeon et al, "Nanometer-Scale Oxide Thin Film Transistor with Potential for High-Density Image Sensor Applications," ACS Applied Materials & Interfaces, vol. 3, No. 1, 1-6 (2011).

Rogers et al., "Low-voltage 0.1 µm organic transistors and complementary inverter circuits fabricated with a low-cost form of near-field photolithography," Appl. Phys. Lett. 75, 1010 (1999).

* cited by examiner

METAL OXIDE THIN FILM TRANSISTOR FABRICATION METHOD

RIGHTS OF THE GOVERNMENT

The invention described herein may be manufactured and used by or for the Government of the United States for all governmental purposes without the payment of any royalty.

CROSS-REFERENCE TO RELATED APPLICATIONS

This application is related to U.S. patent application Ser. No. 14/250,032, filed on even date herewith by Burhan Bayraktaroglu, and entitled "Method of Fabricating Ultra Short Gate Length Thin Film Transistors using Optical Lithography" (AFD 1294), the entirety of which is incorporated by reference herein.

BACKGROUND OF THE INVENTION

1. Field of the Invention

The present invention relates to methods for forming transistors, and more particularly to methods for forming thin film transistors.

2. Description of the Related Art

Thin film transistors (TFT) are the basic building blocks of large area electronic circuits such as those used in the backplanes of active matrix liquid crystal displays (AMLCD) of the type often used in flat panel monitors and televisions. In these applications, TFT circuits are used to control the activation of pixels that make up the display. In some applications, thin film circuits may be produced over non-planar surfaces and in other applications they may be required to be optically transparent to visible light. Yet in other applications, they may be fabricated on flexible substrates. Conventional transistors made on single crystal substrates cannot generally be used in these unique applications.

Historically, TFTs have been made from amorphous silicon (a-Si) or poly-silicon (p-Si) films to satisfy the application requirements described above, rather than the single crystal Si as it is the case with conventional electronic circuits such as microprocessor circuits of modern computers. Transistors made from a-Si and p-Si, however, suffer from a number of deficiencies including low electron mobility, light sensitive operation, limited switching ratios, and/or poor threshold voltage uniformity. These deficiencies make a-Si TFTs generally unsuitable for the current generation of display circuit applications that demand higher switching speeds and accuracy.

In recent years, metal-oxide semiconductors have been considered for display electronics applications. Among several metal-oxide semiconductors that are useful for thin film applications, Zn, In, Sn, Ga, and Hf containing metal-oxides have shown good promise. One of the more promising metal-oxide semiconductors for thin film and transparent transistor applications is ZnO. ZnO is transparent because of its wide band gap (3.4 eV), has high thin film electron mobility, and can be easily prepared by several deposition techniques. ZnO and related composition thin film transistors have been shown to be suitable for high performance circuit applications beyond display electronics because of their superior electronic properties. Some of these applications include microwave signal amplification, microwave signal switching and mixing, high speed logic circuits, and high speed control electronics. While ZnO is a simple binary compound and its composition is readily controlled in manufacturing environment, other metal-oxide based thin film semiconductors are also useful when they are a mixed combination of several metal-oxides. For example, indium zinc oxide (IZO) or indium zinc gallium oxide (IGZO) are ternary and quaternary compound semiconductors that are also being used.

The speed of thin film transistors relates directly to their gate length, which must be kept as short as possible to lower electron transport time between electrodes and improve its high frequency response characteristics. Since current density is proportional to W/L, where W is the gate width and L is the gate length, reduced gate length improves device current capability. Photolithography, which is the main technology used in defining electrode dimensions for TFTs, is limited in scope to fabrication line widths larger than 1 micrometer. Advanced lithography techniques applied to modern single crystal microelectronics rely on extremely well controlled substrate surface flatness and resist uniformity. These conditions cannot be maintained for thin film electronics and therefore only large gate lengths have been possible in the past. This is especially true for metal oxide TFTs, whose fabrication technology is less mature than Si.

In a bottom gate TFT 10, as shown schematically in FIG. 1, a first layer to be fabricated on a substrate 12 is a conductive gate metal 14. Other layers are fabricated over this layer in sequence during fabrication. Unwanted portions of each layer are removed by etching while protecting the portions of the layer with protective films such as photoresist. A major difficulty in metal oxide TFT manufacturing is the fabrication of source 16 and drain 18 contact metals over a semiconductor channel layer 20. The fabrication processes used to establish source 16 and drain 18 contacts often cause damage to the channel layer 20.

There are multiple sources of damage in conventional processes. One source of damage is the chemicals used in lithography techniques. In a commonly used lift-off technique, where the areas are defined in a photoresist layer before the deposition of source and drain metals, the semiconductor surface is exposed to both the photoresist and its developer. Both the photoresist and the developer can damage the semiconductor surface by etching it or by contaminating it. In an alternative approach, continuous metal layers may be fabricated over the entire surface and unwanted regions of this metal layer can be removed by masking and etching. There are at least two sources of damage in this method. First, the surface may be contaminated by the residue of the metal or the etchant due to incomplete metal removal. The etchant may also leave residual contaminants. Second, most chemicals used for etching the metal layer also causes etching of the semiconductor surface. Metal oxides, such as ZnO, are highly soluble in most common acids and bases, even when they are highly diluted. Even oxidizing chemicals such as hydrogen peroxide alone can damage ZnO surface. Many of the common reactive ion etching techniques based on chlorine chemistry, such as $BCl_3$ and $CCl_4$, also etch or damage the ZnO film.

Because of these well-known fabrication issues, a common approach is to make use of physical masks, typically made of thin metal layers, to shield, during layer deposition, the portions of the surface where separation between source 16 and drain 18 contacts is desired. The physical mask layer fabrication method has severe limitations in the feature sizes that can be used. Instead of the desired dimensions in micrometers, this method is only capable of producing devices with feature sizes of millimeters. The placement accuracy of the physical mask over the wafer is not well controlled resulting in gross errors in registering contact layers with respect to gate metal. The edges of metal lines fabricated in this method have poor definition due to shadowing effects and result in uncontrolled device parameters.

A method of overcoming part of this problem was described in U.S. Pat. Nos. 7,910,920 and 8,119,465 and U.S. Publication No. 2006/0043447. According to the various versions of the method described, a protective insulating layer is produced over the channel layer first. Portions of this layer are removed in a dry etch process without removing the underlying ZnO channel layer. Source and drain contact layers are produced over the protective layer and allowed to make contact with the channel layer in the regions where the protective layer was previously removed by dry etching. This method adds several fabrication steps in manufacturing and results in degradation of device performance due to damaged layers or contamination resulting from additional processing steps. For example, the fabrication of silicon dioxide or silicon nitride as the protective layer introduces hydrogen and/or nitrogen into the channel layer. Both of these contaminants are dopants for ZnO and therefore increase the channel conductivity. The presence of the protective layer on the channel modifies the device characteristics depending on the charges in this protective layer and at the interface between it and the channel layer.

A variation of the protective layer approach was described in U.S. Pat. No. 8,129,717. In this approach, the protective layer is a highly doped semiconductor, which also serves as an intermediate contact layer under the source and drain electrodes. This protective layer absorbs damage during etching of the metal between source 16 and drain 18 electrodes. It is subsequently removed by etching. The fabrication and the removal of this protective layer complicate the process and introduce sources of fabrication uncertainties across the wafer.

In another method described in U.S. Pat. No. 7,915,075, source and drain contact metal is etched in a chlorine based plasma such as $CCl_4$, $BCl_3$, or $SiCl_4$. Since these etch types are not highly selective to ZnO or other metal oxide semiconductors, a portion of the active channel region is also etched. Apart from the fact that such etching conditions produce contaminated surface, they also result in uneven etch rates across the wafer. The resulting device characteristics are therefore not uniform across the wafer.

In a similar technique described in U.S. Pat. No. 7,994,510, the source and drain metal is first fabricated on plasma treated semiconductor film and then etched to reveal the semiconductor surface. Further etching of the semiconductor surface is needed, however, to remove the damaged layer.

In the approach taken in U.S. Pat. No. 8,187,919, the damaging effects of etching metal on the active layer is mitigated by the fabrication of the semiconductor layer after the source and drain contacts are fabricated. However, it is well known that ZnO fabricated on top of metal layers often produces non-ohmic or high resistivity electrical properties, unlike the low resistivity ohmic properties of ZnO layers that are contacted from the top surface.

As set out above, a critical dimension that influences device performance is the distance between the source and the drain electrodes. This distance is the effective device gate length 22, as shown in FIG. 1. The gap between source 16 and drain 18 electrodes can be produced by several techniques including "lift-off" and "etching." In the lift-off technique, photoresist patterns are fabricated by opening areas in the resist corresponding to the electrodes. These areas are filled with evaporated metal. Excess metal over the photoresist is removed by dissolving it in solvent. In the etching technique, the metal layer is first produced over the entire surface by for example sputtering techniques. Photoresist patterns are then produced over the metal layer to mask areas that correspond to the electrodes. The unprotected metal surfaces are etched until all metal in these areas are removed. As indicated above, it is important that the etchant used to remove the metal layer does not also etch the semiconductor layer or damage its surface. In either approach, the critical dimension is the gate length 22. Using photolithography, the minimum gate length that can generally be produced is about twice the wave length of the light used to expose the photoresist. The highest speed metal oxide TFTs using this technique had about 1 micrometer gate lengths. Similar size gate lengths were achieved for amorphous Si based TFTs as described in U.S. Pat. No. 7,537,979.

An alternative photolithography-based fabrication method was described in U.S. Pat. Nos. 5,532,180 and 5,872,370. In this approach, the source and drain electrodes are fabricated separately. By relying on positioning accuracy of the equipment, these transistor electrodes were placed closer to each other than the optical resolution of the photolithography tool. However, these approaches introduce an additional process step which can be a source of additional surface damage to the semiconductor layer. Also, the positioning approach may additional introduce alignment errors in both X and Y dimensions so that across the wafer there may be rotational misalignments. The minimum gate length sizes were limited to 1-4 micrometers due to these restrictions.

Shorter gate lengths can be fabricated using expensive lithography techniques such as "Leading-edge KrF Scanner" technique with special photoresists, near-field lithography, nanoimprint technology, and electron beam lithography. These sophisticated lithography techniques are slow, expensive and generally not compatible with the thin film electronics produced over large area substrates.

Accordingly, there is a need in the art for methods of fabricating thin film transistors without the drawbacks or difficulties associated with contemporary fabrication methods.

SUMMARY OF THE INVENTION

Embodiments of the invention provide a method of fabricating a thin film transistor. According to these embodiments, an insulating layer and a metal gate contact layer are deposited on a substrate. The insulating layer is positioned between the gate contact layer and the substrate. A portion of the metal gate contact layer is selectively removed utilizing reactive ion etching incorporating a gas that etches the metal gate contact layer but not the insulating layer. A plurality of layers is deposited over a remaining portion of the metal gate contact layer and insulating layer. The plurality of layers includes a gate insulating layer, a channel layer, and a metal film. A portion of the metal film is selectively removed utilizing reactive ion etching incorporating the gas that etches the metal film but not the channel layer to form the thin film transistor. The insulating layer in these embodiments is comprised of a high resistivity insulator that can be deposited at temperatures less than 400° C. and channel layer is comprised of a metal oxide semiconductor.

In some embodiments, the metal-oxide semiconductor contains a metal element such as Zn, In, Sn, Ga, or Hf. In a particular embodiment, the metal-oxide semiconductor is ZnO. In other embodiments, the metal-oxide semiconductor may contain a metal-oxide alloy, such as IGZO. In some embodiments, the metal gate contact layer and the metal film may be comprised of W or a Ti—W alloy. In some of these embodiments, the high resistivity insulator may consist of $SiO_2$, $Al_2O_3$, $HfO_2$, or $Si_3N_4$, for example.

In some embodiments, the gas utilized in the reactive ion etching is $SF_6$. In some of these embodiments, the $SF_6$ gas may be diluted with 0 to 10% $O_2$. Additionally, a plasma of the reactive ion etching may have a power rating of approximately 20 to 100 watts. In some embodiments, the gate insulator layer is deposited at temperatures lower than 200° C.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention described here overcome the problems associated with the fabrication of source and drain contacts of a metal oxide thin film transistors (TFT) using refractory metals and low damage reactive ion etching methods with sulfur hexafluoride ($SF_6$) as the reactive gas. Damage to the surface of the semiconductor layer may be avoided with a choice of metals, which do not form an alloy with the semiconductor within the process temperature range. The reactive gas etches contact metal uniformly with negligible undercut while not damaging the semiconductor layer. Physical damage due to ion bombardment may also be minimized with the adjustment of process parameters.

Figure 1:
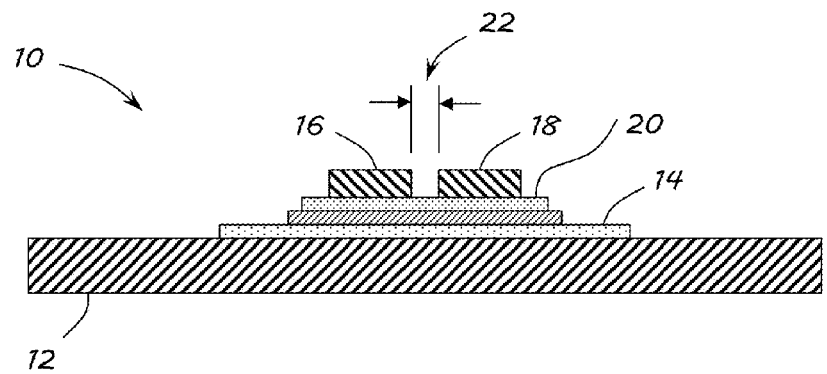
FIG. 1 is a schematic illustration of a common bottom gate thin film transistor.
Figure 2:
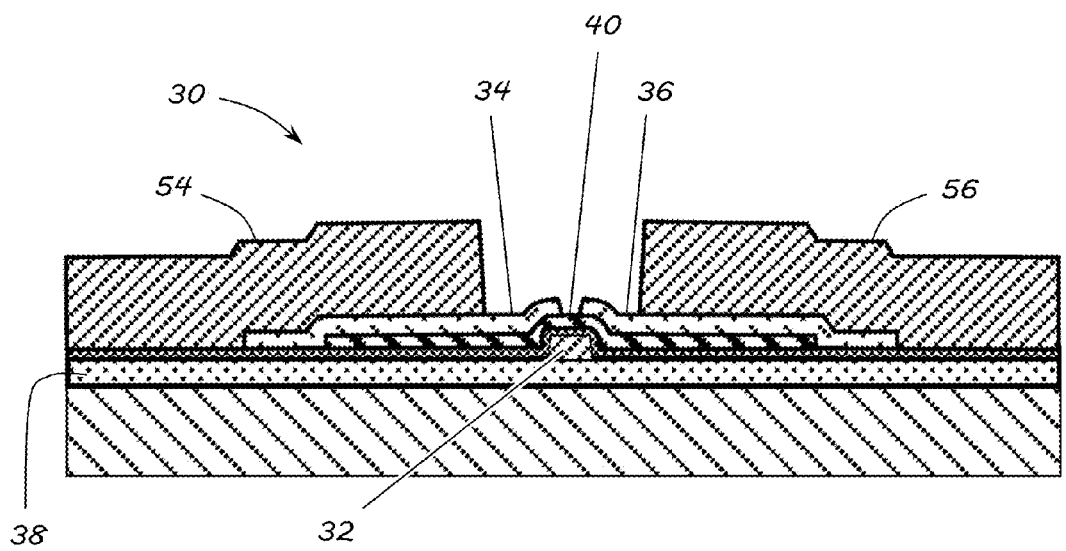
FIG. 2 is a schematic illustration of a metal oxide thin film transistor fabricated according to embodiments of the invention.

An exemplary TFT 30 is illustrated in the schematic drawing in FIG. 2. Refractory metals such as W and Ti—W alloys may be used in the fabrication of all electrodes of the transistor in some embodiments, including gate 32, source 34, and drain 36. Whereas the gate electrode 32 does not contact the semiconductor layer, both source 34 and drain 36 electrodes make ohmic contacts with the semiconductor. Ohmic contacts refer to non-blocking, non-rectifying contacts that have specific contact resistance of $1\times10^{-4}$ ohm/$cm^2$ or less. The fabrication of all metal electrodes may follow the same fabrication approach of producing metal films over the surface, patterning selected areas with photolithography, and reactive ion etching in, for example, $SF_6$. Various metal deposition techniques may be used to produce refractory metal films including sputtering, evaporation, pulsed laser deposition, atomic layer deposit ion, etc. Other techniques relying on chemical synthesis and high temperatures, such as chemical vapor deposition (CVD), are generally avoided to prevent contamination of the semiconductor layer.

An insulator layer 38 may be inorganic $SiO_2$, $Al_2O_3$, $HfO_2$, $ZrO_2$, etc. or organic polyimide, etc. or other films commonly used in microelectronics. A semiconductor film composing a channel layer 40 may be made from metal oxide semiconductors based on Zn, In, Ga, and Hf. These metal oxide semiconductors may be simple binary compounds such as ZnO or an alloy of various metal oxides, such as indium gallium zinc oxide (IGZO). The semiconductor films may be deposited by a range of techniques including pulsed laser deposition (PLD), sputtering, atomic layer deposition (ALD), CVD, chemical synthesis, etc. These films may be used as-deposited or may be subjected to thermal anneal cycles, which may assist in improving their physical and electrical properties. The refractory gate metal is generally tolerant to such thermal anneals.

The metal layer for source 34 and drain contacts 36 may be produced on the semiconductor film of the channel layer 40 at temperatures lower than 200 C to assist in preventing intermixing of these layers. Photolithographic techniques may be employed to define the source 34 and drain 36 electrodes. The areas not protected by photoresist may then be etched by $SF_6$ reactive ion etching (RIE). Because of very high selectivity in etch rates of metal and the semiconductor films, this etch process self-terminates at the semiconductor surface. Proper selection of etch parameters ensure that film undercut is minimized for high fidelity line definition while also reducing physical damage to the semiconductor due to ion bombardment. The absence of argon gas, which has been used in similar applications, assists in ensuring that the photoresist mask and the channel layer are not damaged during etching by heavy ion bombardment.

FIGS. 3A-3F illustrate an exemplary step by step process for fabricating a TFT consistent with embodiments of the invention. Beginning with FIG. 3A, a gate metal layer 42 is produced on a top surface of a substrate 44, which in some embodiments may be previously coated with an insulator layer 46, by sputter deposition or other technique as set out above. The insulator layer 46 serves to electrically isolate the gate metal from the substrate. High resistivity insulators used for the insulator layer 46 may include $SiO_2$, $Al_2O_3$, $HfO_2$, or $Si_3N_4$. The thickness of this layer may range from about 0-10 micrometers or higher, with the TFT illustrated in FIG. 3A having a thickness of about 1 micrometer. Thicker insulators may assist in providing higher voltage isolation from the substrate. The insulator layer may be omitted in some configurations if the substrate is already highly insulating. The metal film of the gate metal layer 42 may consist of W in some embodiments or TiW in other embodiments, with a particular embodiment have an TiW alloy having 10% Ti. A thickness of the gate metal lay may be approximately 150 nm, though thicker and thinner layers may also be used. Thicker films may be used to assist in reducing gate resistance.

Figure 3A:
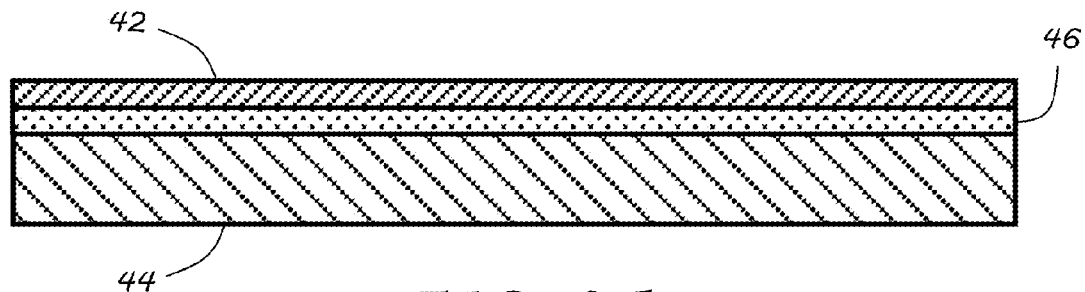
FIGS. 3A-3F illustrate fabrication steps for a thin film transistor, such as that in FIG. 2, consistent with embodiments of the invention.
Figure 3B:
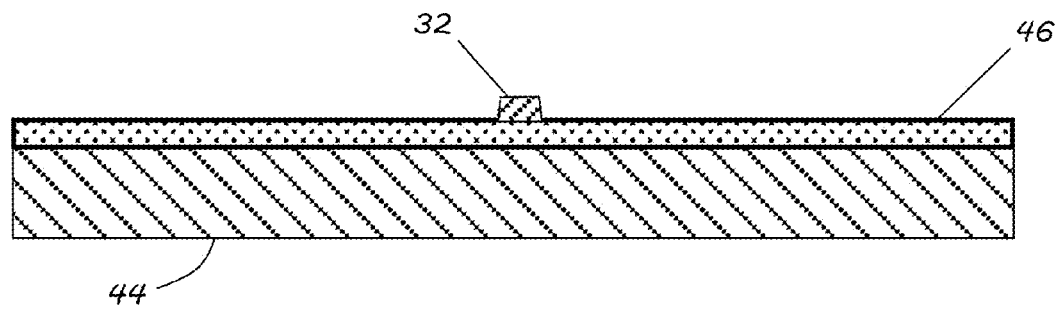

Turning now to FIG. 3B, photolithographic or other lithography techniques may be used to protect regions of the gate metal layer 42 corresponding to gate electrodes 32. Reactive ion etching (RIE) techniques including inductively coupled plasma (ICP), for example, may be used to etch any unprotected metal regions. In order to avoid the problems associated with contemporary etching steps, a gas that may be selected that will etch the unprotected gate metal layer 42, but not etch the insulator layer 46. Undiluted $SF_6$ gas may be used in this etching step. Plasma power ranging from approximately 25-100 W may be used for a gas flow rate of approximately 40 sccm and background pressure of approximately 40 mTorr. This or similar settings of reactors produce low DC voltage of approximately 20-100V and etch rates of about 15-200 nm/min. In some embodiments, the $SF_6$ gas may use may be pure, though in other embodiments the $SF_6$ gas may be diluted with small amounts of $O_2$ ranging from approximately 0-10%. In an exemplary embodiment using $SF_6$ diluted with about 10% $O_2$, an etch rate of approximately 100 nm/min may be achieved with a power level of about 90 W and a DC bias of about 95V. An $O_2$ gas flow rate of approximately 10 sccm may be used to achieve the 10% dilution. After plasma etching, the masking layer is removed.

Figure 3C:
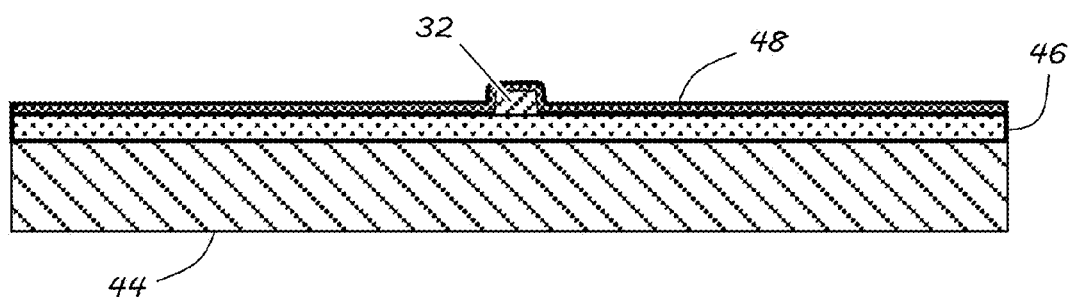

As illustrated in FIG. 3C, a gate insulator 48 is fabricated conformably over exposed surfaces of the insulator layer 46 and gate electrode 32 using deposition techniques such as plasma enhanced chemical vapor deposition (PECVD), CVD, ALD, sputtering or other techniques commonly used in microelectronics. The insulator 48 may consist of $SiO_2$, $Al_2O_3$, $HfO_2$ or some other high resistivity insulator that can be deposited at temperatures less than 400° C. The insulator may be fabricated at even lower temperatures, such as 200° C. or less. The thickness of the insulating layer may range from about 5-500 nm depending on applications. Thinner films are generally preferred for high speed devices whereas thicker films are generally preferred for higher voltage operation.

Figure 3D:
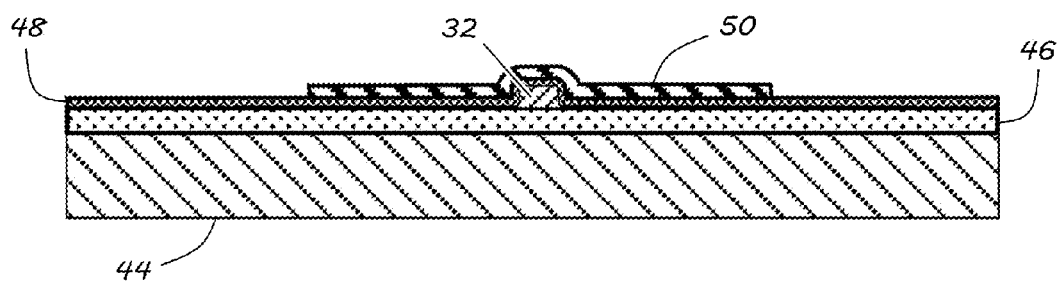
Figure 3E:
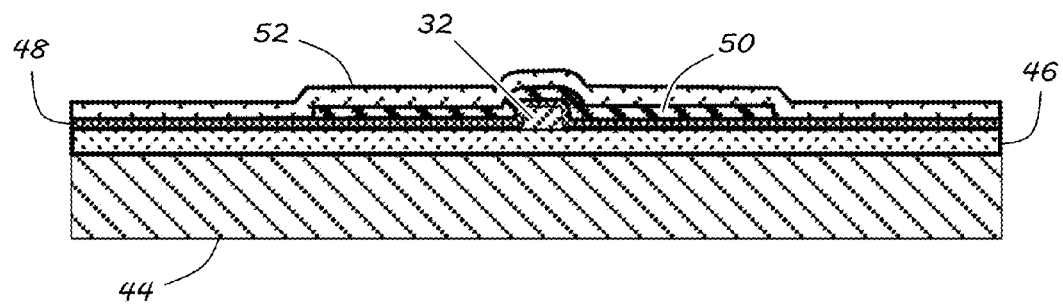

A semiconductor film forming a channel layer 50 is fabricated over the gate insulator 48, as illustrated in FIG. 3D, using a PLD technique, though other techniques such as sputtering, ALD, CVD, and chemical synthesis may also be used. In the illustrated embodiment, the film forming channel layer 50 consists of ZnO and is deposited in PLD at about a 200° C. substrate temperature. The film thickness for this illustrated embodiment is approximately 50 nm but other thicknesses may also be used. Portions of the semiconductor film are masked by photoresist using suitable lithography techniques and the unwanted portions of the semiconductor film may then be etched in dilute chemical etchants. Because of high dissolution rate of metal oxide semiconductors in most common acids, very high etch selectivity is achieved between the semiconductor film and gate insulator etch rates. In the illustrated embodiment, a chemical etchant having a ratio of about 1:1000 of hydrochloric acid to water is used, though other etchants with other concentrations may also be used. This etchant removes the ZnO layer in about 30 seconds and does not etch the gate insulator layer.

Figure 3F:
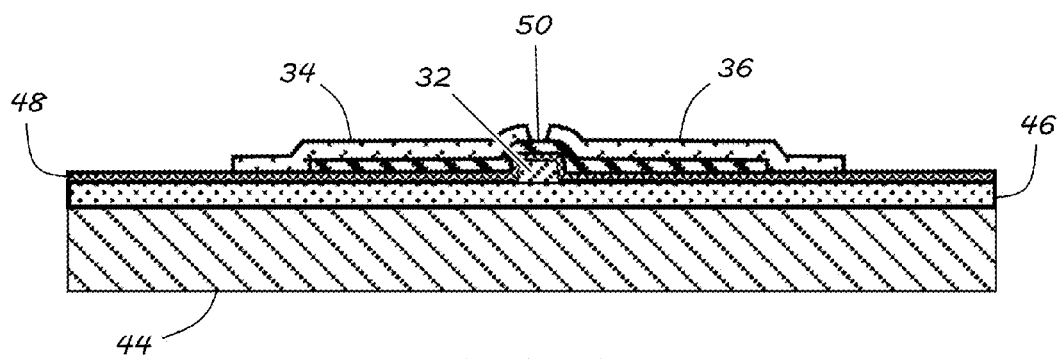

A metal film 52 is fabricated over the channel layer 50 and over the gate insulator 48 outside the active device area. The deposition methods and the film thickness are similar to those used for the gate metal 42 described above. In the illustrated embodiment in FIG. 3E, a metal film 52 is produced by sputtering at room temperature to a nominal thickness of about 150 nm, though other thicknesses may also be used for other devices and applications. Lithographic techniques are used to mask the areas corresponding to source 34 and drain 36 electrodes. As illustrated in FIG. 3F, unwanted portions of the metal film 52 are etched in $SF_6$ plasma similar to the gate metal 42 above. The masking layer is removed after etching in solvents without impacting the surface quality of the semiconductor layer.

Because it is desirable to keep the electrical resistance of source and drain electrodes low and to provide interconnection lines between devices, additional metallization steps may be employed. Low resistance metal lines may be applied by techniques well known in the field of microelectronics, by for example lift-off technique, to make connection to all 3 electrodes of the transistor. Connections 54 and 56 respectively to source and drain electrodes are shown in FIG. 2. A connection to the gate electrode 32 is not shown since it is out of the cross-sectional view of FIG. 2. To ensure contact is made to the gate electrode without interference of the gate insulator, holes may be produced in the gate insulator by lithography and etching of the gate insulator prior to metallization. The interconnect metal is typically a low resistivity metal such as gold, aluminum, copper, silver, or other metals or alloys of these metals or layered combination of metals. The thickness of the interconnect metal is usually larger than the refractory metal used for gate, source or drain contacts to maintain low resistivity and line continuity over steps. Typically, this metal thickness is about 1-10 μm, with the illustrated embodiment having about a 3 μm thickness.

Figure 4:
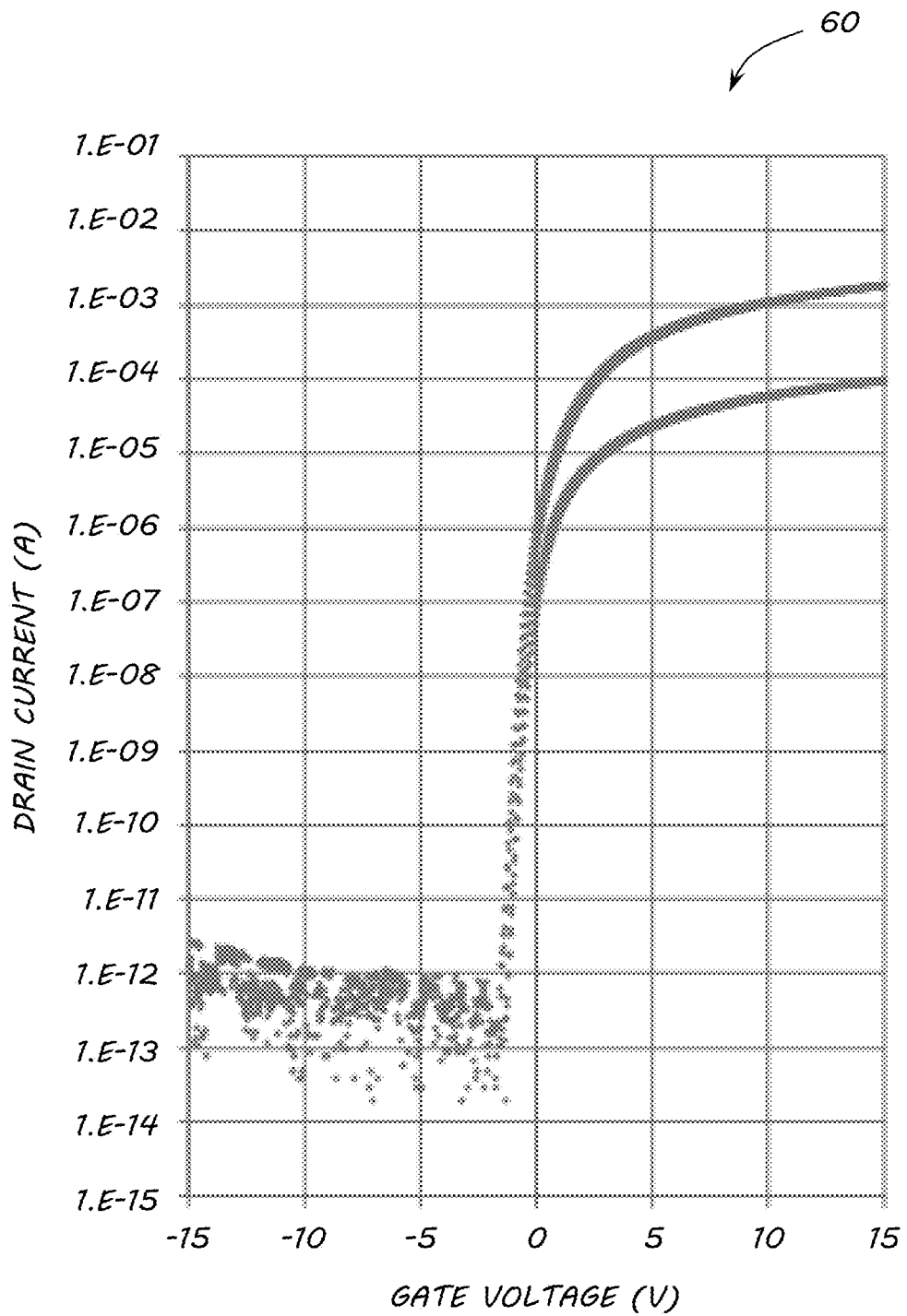
FIG. 4 is a graph illustrating transfer characteristics of a ZnO thin film transistor fabricated according to embodiments of the invention.
Figure 5:
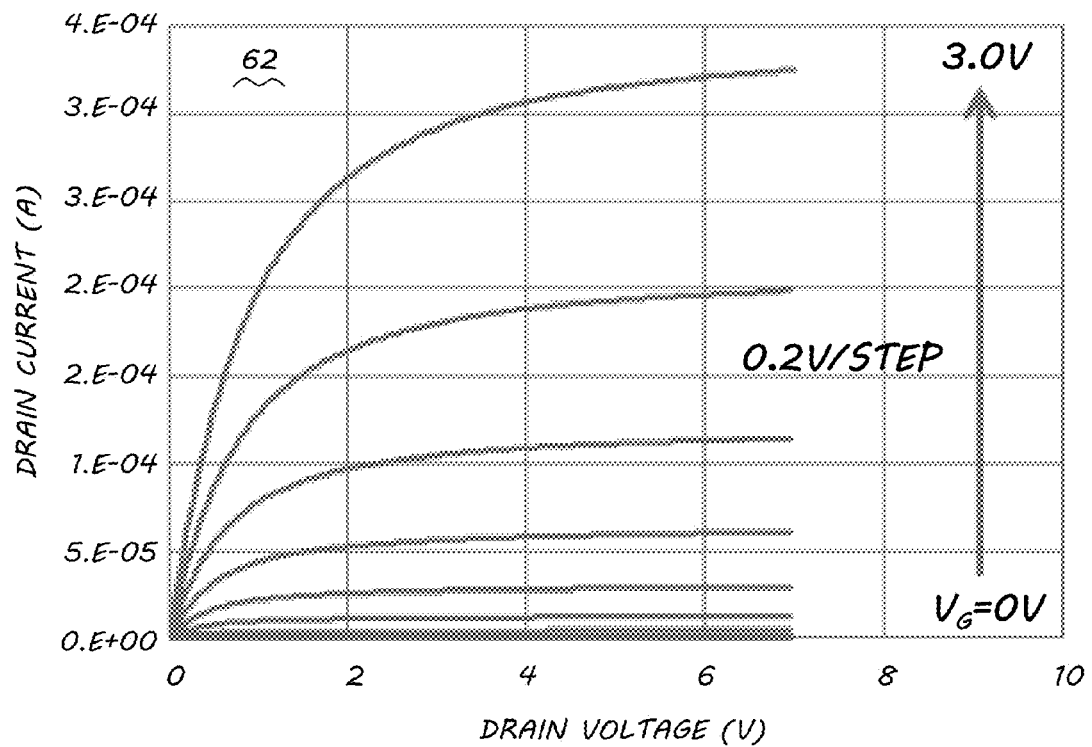
FIG. 5 is a graph illustrating output characteristics of the ZnO thin film transistor in FIG. 4.

Graph 60 in FIG. 4 shows transfer characteristics of a thin film ZnO transistor fabricated on a Si wafer employing the steps of the fabrication method set out above. It is apparent from the graph that the transistor is able to turn on and turn off with applied gate bias voltage and on/off ratios of better than $10^{10}$ are obtainable. Additionally, the output characteristics of the transistor shown in graph 62 in FIG. 5 illustrates that the source and drain contact have excellent ohmic behavior.

Figure 6:
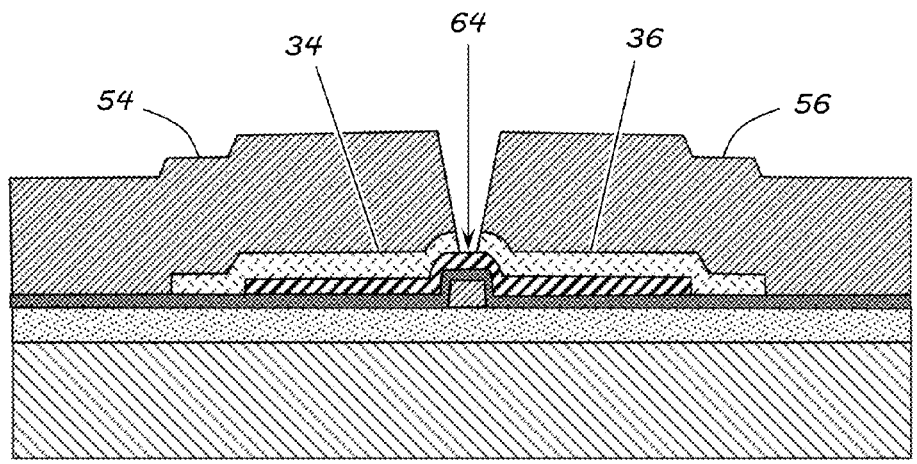
FIG. 6 is a schematic illustration of a metal oxide thin film transistor fabricated according to an alternate embodiment of the invention.

As an alternative to the fabrication method set out above, the fabrication steps of source 34 and drain 36 electrodes and corresponding interconnects 54, 56 metallization may be combined. In this alternative method, the interconnect 54, 56 metallization may be used as the mask to define source 34 and drain 36 electrode areas instead of photoresist masks used previously. After producing refractory metal over the semiconductor layer, interconnect metal lines may be fabricated by, for example, a lift-off technique. This metal may then be used as an etch mask to remove selected areas of the refractory metal to reveal the semiconductor layer surface 64, as illustrated in FIG. 6.

The above fabrication method may additionally be utilized in the following fabrication method, which assists in overcoming the problems associated with the fabrication short gate length metal oxide TFTs using conventional photolithography techniques. Embodiments of the method set out below, which rely on fabrication of self-aligned contacts with a controlled gap between them, is compatible with large area substrates. The gap, i.e. gate length dimension, may be controlled by process parameters rather than lithography resolution.

Figure 7:
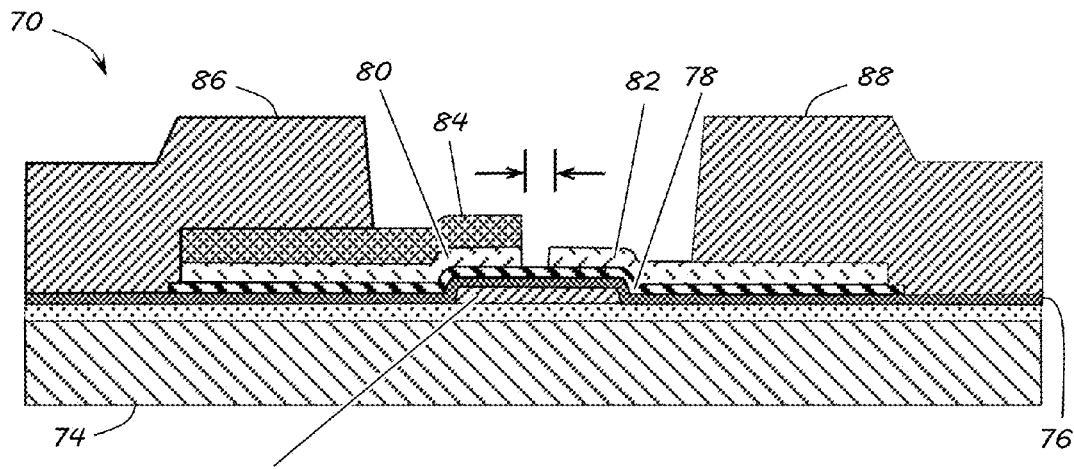
FIG. 7 is a schematic illustration of an ultra short length metal oxide thin film transistor fabricated according to embodiments of the invention.

Referring now to FIG. 7, which illustrate an exemplary staggered gate thin film transistor 70 using a thin film of a metal oxide semiconductor as the active channel region, a gate electrode 72 is first fabricated on a substrate 74 by conventional methods such as those discussed above. In practice, the width of the gate electrode 72 is slightly larger than the dimensions of the source-drain gap. However, the width of the gate electrode 72 is exaggerated in FIG. 7 for clarity.

The gate electrode 72 is covered with an insulator layer 76, which may be made of inorganic $SiO_2$, $Al_2O_3$, $HfO_2$, $ZrO_2$ etc. or organic polyimide, etc. or other films commonly used in microelectronics to isolate it from the semiconductor channel 78. The semiconductor films for the channel 78 may consist of metal oxide semiconductors based on Zn, In, Ga, and Hf. They can be simple binary compounds such as ZnO or an alloy of various metal oxides, such as indium gallium zinc oxide (IGZO), for example. The semiconductor films may be deposited by a range of techniques including pulsed laser deposition (PLD), sputtering, atomic layer deposition (ALD), CVD, chemical synthesis etc. These films may be used as-deposited or can be subjected to thermal anneal cycles to improve their physical and electrical properties. Source 80 and drain 82 contacts are may be made of refractory metals such as tungsten or TiW. A second metallization layer 84 may be used to define the source electrode 80. The underlying refractory metal may then be etched along an edge of this second metal layer. Additional process steps may then be employed to define the drain electrode 82 area and to fabricate the interconnect metallization 86, 88.

According to embodiments of the invention, the self-aligned source and drain contacts produce a controlled gap between them. The dimension of this gap may range from a few nanometers to several micrometers depending on the process parameters. Since the gap between the contacts is a result of a self-aligned process, its dimension is independent of orientation on the substrate. In other words, the same size gaps may be fabricated across the substrate regardless of the shape, size, or the orientation of the contacts.

Figure 8A:
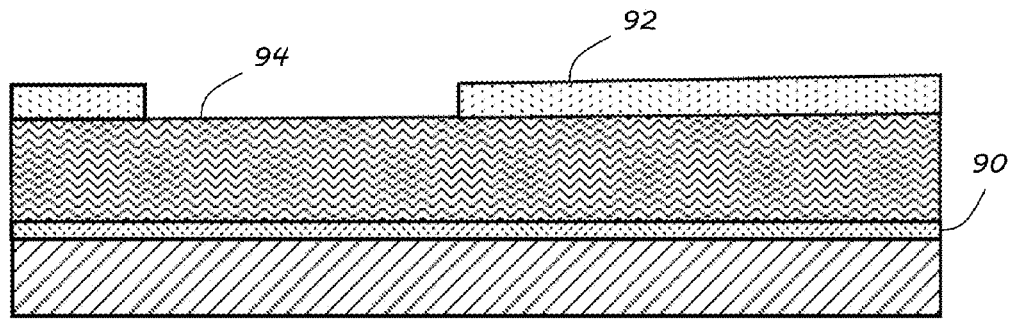
FIGS. 8A-8E illustrate fabrication steps for a thin film transistor, such as that in FIG. 7, consistent with embodiments of the invention.

Turning now to FIG. 8A, a surface of a refractory metal 90 is covered with 2 layers of photosensitive material. A top layer 92 is selected to be sensitive to longer wave length optical radiation than a bottom layer 94. For example, the top layer 92 may be sensitive to G- or I-line radiation at 405 nm and 385 nm, respectively. Most conventional photoresists may be used for this purpose. The bottom layer 94 is selected to be sensitive to shorter wavelength radiation, such as 256 nm, for example. PMMA or PMGI type photoresists can be used for this purpose. The bottom photoresist 94 may also be selected such that it is not soluble in chemicals used for developing or stripping the top photoresist 92. The bottom layer 94 should also be able to withstand higher temperature processing than the top layer 92 and does not mix with the top layer 92.

Figure 8B:
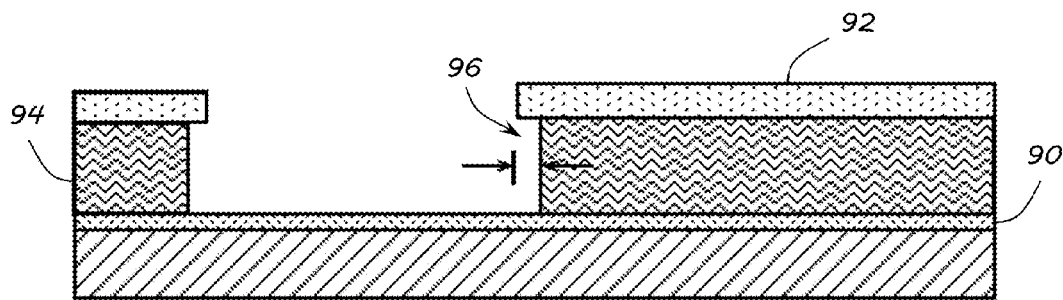

A source contact pattern is defined in the top photoresist 92. This layer is then used as a mask to expose the bottom photoresist 94 at a shorter wave length radiation. Since the top layer 92 is opaque to this wavelength, only the parts of the bottom photoresist 94 will be exposed. As illustrated in FIG. 8B, a bottom photoresist 94 opening may be made slightly larger than an opening of the top photoresist 92. The amount of enlargement may be controlled by process parameters including photoresist soft bake temperature and duration, exposure dose, and developer chemistry and duration. In an exemplary embodiment, for example, for a 1 μm thick bottom layer 94 made of PMGI that is soft baked at approximately 200° C. for about 4 min, and exposed to 256 nm radiation at a dose of about 125 $mJ/cm^2$ for 150 sec and developed in for about 75 sec, an enlargement (undercut) 96 of approximately 200 nm may be obtained. For an exposure time of about 120 sec, the undercut 96 amount be reduced to approximately 100 nm.

Figure 8C:
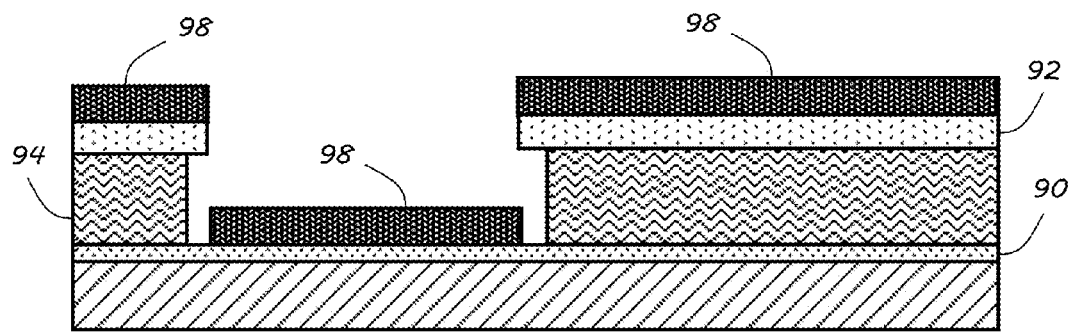

A thin metal layer 98 or a layered combination of metals, such as Ti, Pt, Al, Au, Ni, etc. may be evaporated on the structure in FIG. 8B at a normal incidence. A thickness of this metal layer 98 may range from approximately 10 nm to 1 μm. In the illustrated embodiment in FIG. 8C, the thickness of the metal layer 98 is approximately 0.25 μm. Because the evaporated metal 98 will be used to mask the refractory metal 90 below it, the evaporated metal 98 should be different than the refractory metal 90. Inside the opening, the evaporated metal layer rests on the refractory metal 90. Everywhere else, it rests on a top surface of the top photoresist 92.

Figure 8D:
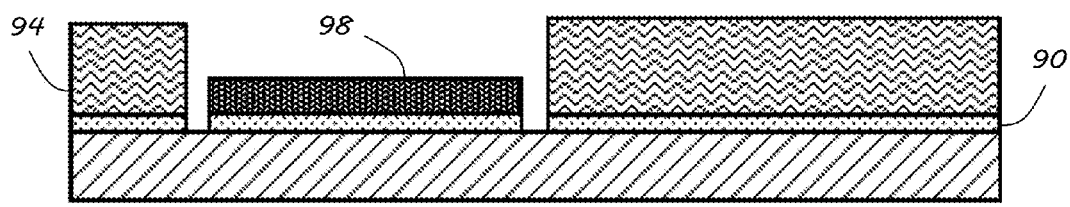

The top photoresist 92 is dissolved in solvents to remove it and the metal layer 98 resting on it as illustrated in FIG. 8D. The separation distance between the evaporated metal 98 inside the opening and a sidewall of the bottom photoresist 94 is equal to the undercut 96 of the bottom photoresist layer. The refractory metal 90 is only exposed between the evaporated metal 98 and the bottom photoresist 94 layers. Reactive ion etching (RIE) or ICP techniques, such as the techniques set out above, may then be used to etch the bottom refractory metal layer 90.

Figure 8E:
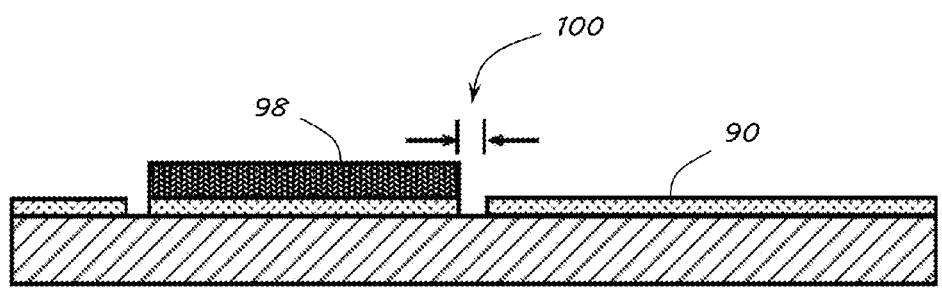
Figure 9:
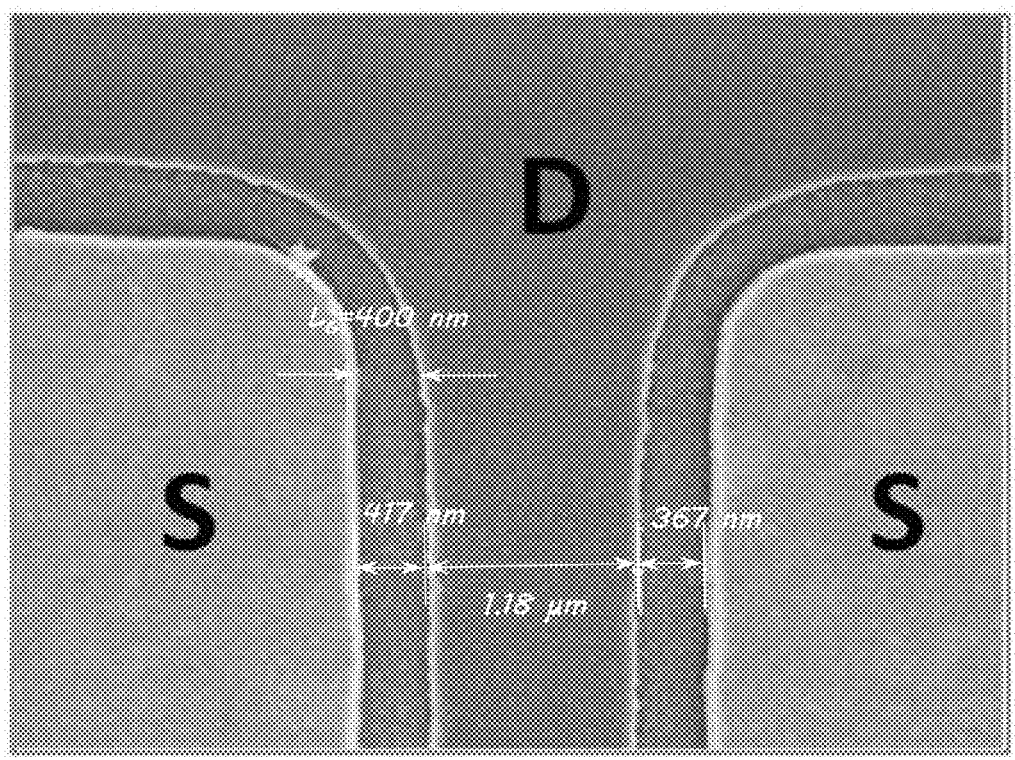
FIG. 9 is a scanning electron microscope image of a gap produced by the fabrication steps of FIGS. 8A-8E.

The bottom photoresist layer 94 may then be removed by dissolving it in solvents leaving behind a gap 100 between metal pads substantially the same as the original undercut amount of the bottom photoresist as illustrated in FIG. 8E. FIG. 9 shows a scanning electron microscope (SEM) image of a sub-micron gap produced by this technique.

Figure 10A:
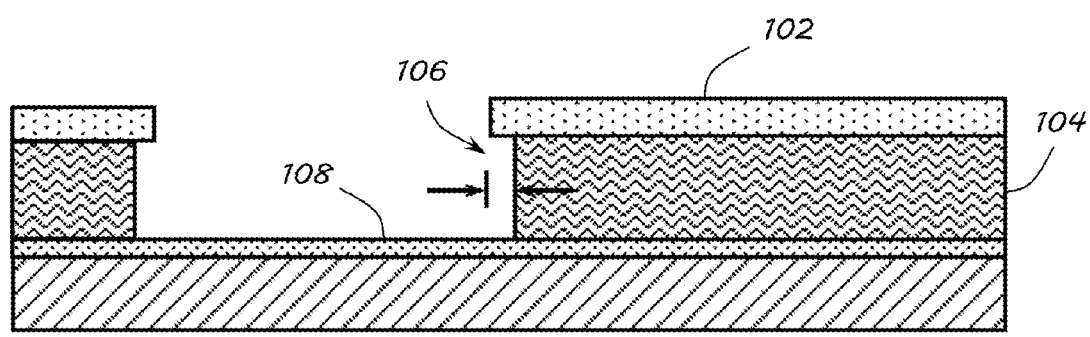
FIGS. 10A-10E illustrate alternate fabrication steps for a thin film transistor, such as that in FIG. 7, consistent with embodiments of the invention.
Figure 10B:
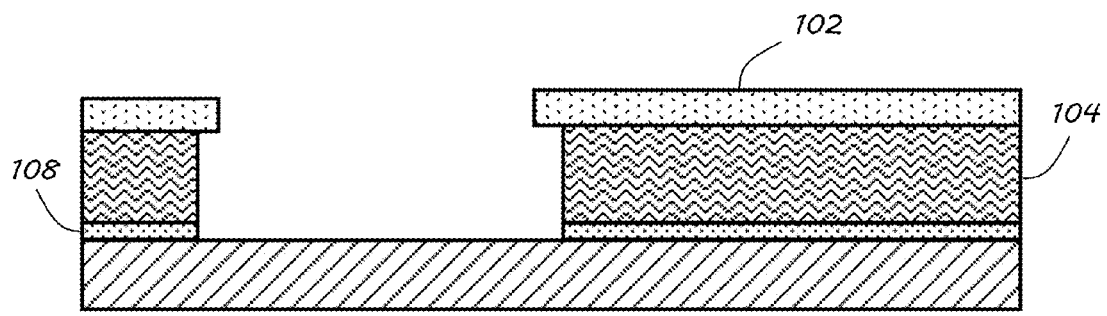
Figure 10C:
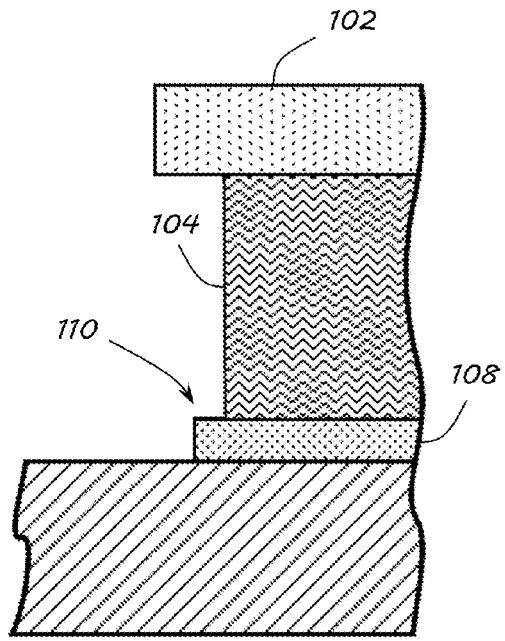
Figure 10D:
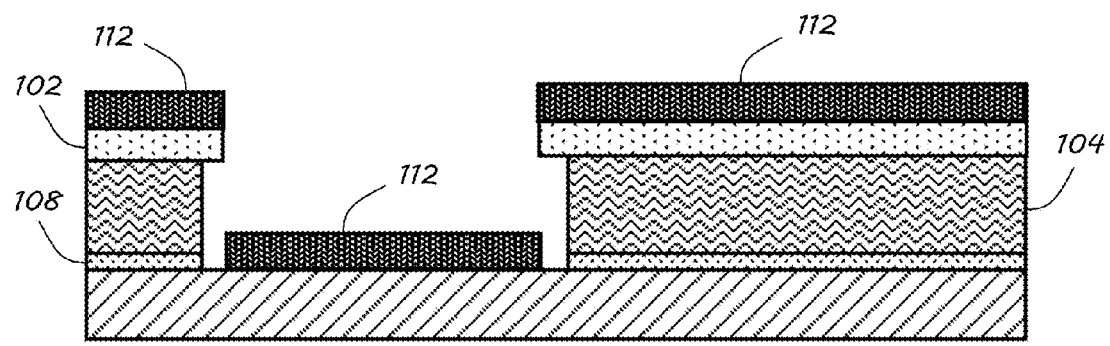
Figure 10E:
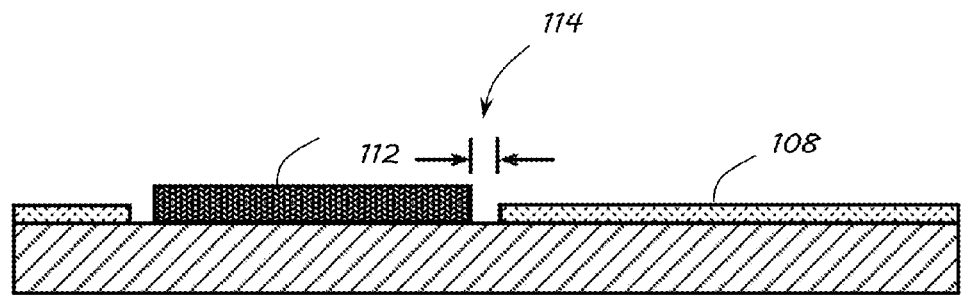
Figure 11:
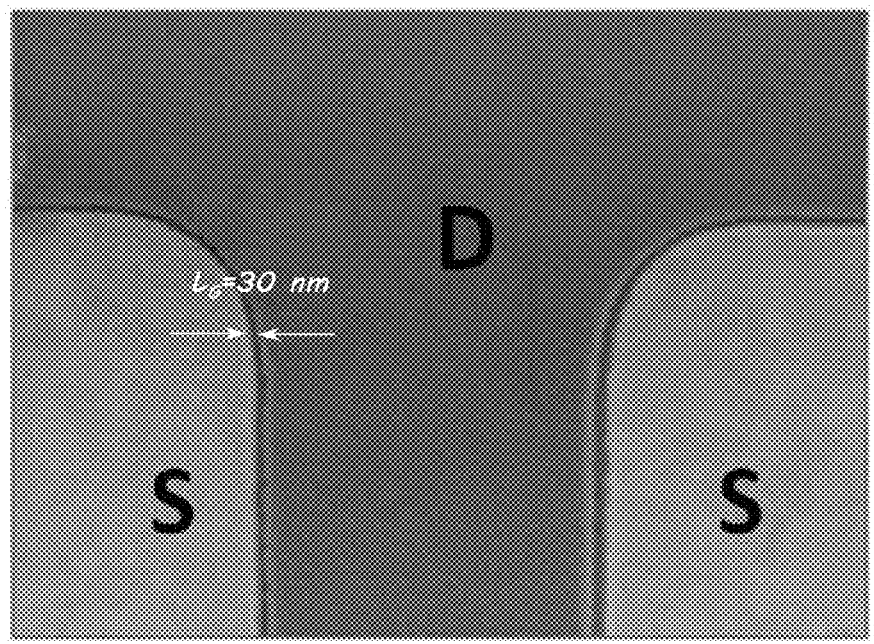
FIG. 11 is a scanning electron microscope image of a gap produced by the fabrication steps of FIGS. 10A-10E.
Figure 12:
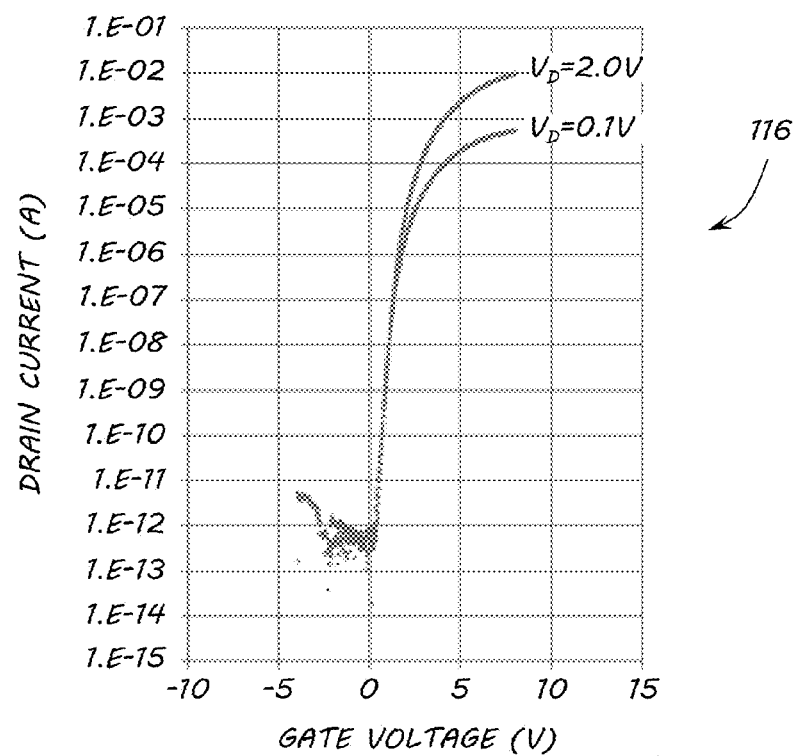
FIG. 12 is a graph illustrating transfer characteristics of an ultra short gate ZnO thin film transistor fabricated according to embodiments of the invention.

In other embodiments, an alternative process sequence may be followed to fabricate self-aligned contacts for thin film transistors. As illustrated in FIG. 10A, this alternative process follows a similar approach as the method above to fabricate dual photoresist layers 102, 104 and an undercut 106. As illustrated in FIG. 10B, bottom metal 108 is removed by RIE as above or by another etching technique inside the openings formed by the dual photoresist layers 102, 104. Due to shadowing effects 110 of the plasma edge, there will be a limit to the amount of effective undercut 106 created as illustrated in FIG. 10C. As illustrated in FIG. 10D, after etching, a second metal 112 may be evaporated onto the structure of FIG. 10B. After evaporation, both photoresist layers 102, 104 are dissolved to remove any excess evaporated metal 112 resulting in the structure illustrated in FIG. 10E. This approach may result in a somewhat smaller gap 114 between the contacts due potential erosion of top photoresist edge during the RIE process and also by any shadowing effects as illustrated above. By including the erosion amount in the process design, this alternative method may be able to produce even smaller gaps than the approach described above. FIG. 11 shows a scanning electron microscope (SEM) image of a sub-micron gap produced by this technique.

Either of these two alternative methods for forming the small gap geometries may be used in, for example, the exemplary process of FIGS. 3A-3F, or to create thin film transistors such as the exemplary transistor in FIG. 7. Graph 116 in FIG.

12 illustrates the transfer characteristics of a ZnO thin film transistor with a 90 nm gate length fabricated using the photoresist undercut.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A method of fabricating a thin film transistor, the method comprising:
    depositing an insulating layer and a metal gate contact layer on a substrate, the insulating layer being positioned between the gate contact layer and the substrate;
    selectively removing a portion of the metal gate contact layer utilizing reactive ion etching incorporating a gas that etches the metal gate contact layer but not the insulating layer;
    depositing a plurality of layers over a remaining portion of the metal gate contact layer and insulating layer, the plurality of layers including a gate insulating layer, a channel layer, and a metal film; and
    selectively removing a portion of the metal film utilizing reactive ion etching incorporating the gas that etches the metal film but not the channel layer to form the thin film transistor,
    wherein the insulating layer comprises a high resistivity insulator that can be deposited at temperatures less than 400° C., and
    wherein the channel layer comprises a metal oxide semiconductor.

2. The method of claim 1, wherein the metal-oxide semiconductor contains a metal element selected from a group consisting of: Zn, In, Sn, Ga, Hf, and combinations thereof.

3. The method of claim 2, wherein the metal-oxide semiconductor is ZnO.

4. The method of claim 2, wherein the metal-oxide semiconductor contains a metal-oxide alloy.

5. The method of claim 4, wherein the metal-oxide semiconductor is IGZO.

6. The method of claim 1, wherein the metal gate contact layer and the metal film are selected from a group consisting of: W, Ti—W alloy, and combinations thereof.

7. The method of claim 1, wherein the gas is $SF_6$.

8. The method of claim 7, wherein the $SF_6$ is diluted with 0 to 10% $O_2$.

9. The method of claim 1, wherein the gate insulator layer is deposited at temperatures lower than 200° C.

10. The method of claim 1, further comprising:
    selectively removing a portion of the channel layer by:
        applying a masking layer to the plurality of layers deposited on the substrate; and
        etching the channel layer in a wet chemical etch solution.

11. The method of claim 10, wherein the wet chemical etch solution includes hydrochloric acid and water.

12. The method of claim 1, wherein a plasma of the reactive ion etching has a power rating of 20 to 100 watts.

13. The method of claim 1, wherein the high resistivity insulator is selected from a group consisting of: $SiO_2$, $Al_2O_3$, $HfO_2$, $Si_3N_4$, and combinations thereof.

* * * * *